United States Patent [19]
Yuhas et al.

[11] Patent Number: 5,350,621
[45] Date of Patent: Sep. 27, 1994

[54] SYSTEM OF ELECTRONIC LAMINATES WITH IMPROVED REGISTRATION PROPERTIES

[75] Inventors: Donald E. Yuhas, Glen Ellyn; Carol L. Vorres; David P. Groppi, both of Mt. Prospect; Jiri D. Konicek, Onalaska, all of Ill.

[73] Assignee: Allied-Signal Inc., Morris Township, Morris County, N.J.

[21] Appl. No.: 982,797

[22] Filed: Nov. 30, 1992

[51] Int. Cl.$^5$ ............................ B32B 3/00; B32B 7/00
[52] U.S. Cl. .................................... 428/209; 428/901; 428/457; 361/750
[58] Field of Search ............... 428/209, 901, 457, 913; 361/401, 748, 749, 750

[56] References Cited

U.S. PATENT DOCUMENTS 5,041,699 8/1991 Soliday ................................. 428/901

OTHER PUBLICATIONS

Coombs, "Printed Circuits Handbook", McGraw Hill, 1989 pp. 34.1–34.5.
Coombs "Printed Circuits Handbook", McGraw Hill, 1988, pp. 3.22–3.23, 6.1–6.3, 7.1–7.7, 31.6–31.9, 32.1–32.4.
Lo, S. Y. and H. T. Hahn, "Hygrothermal Expansion of Kevlar 49/Epoxy and $S_2$–Glass/Epoxy Composites," Trans. Systs. Res. Rpt. UCRL15517, S/C 6641009, Nov. 1982, pp. 1–22.

*Primary Examiner*—Patrick J. Ryan
*Assistant Examiner*—Patrick Jewik
*Attorney, Agent, or Firm*—Harold N. Wells; Mary J. Boldingh; Jay P. Friedenson

[57] ABSTRACT

Dimensionally stable laminates of epoxy resin reinforced with glass fibers have a coefficient of thermal expansion which matches that of copper, making possible copper foil covered laminates which provide improved registration in multilayer printed circuit boards. New glass fabric styles provide balanced thermal expansion in both the warp and fill directions.

13 Claims, 7 Drawing Sheets

SYSTEM OF ELECTRONIC LAMINATES WITH IMPROVED REGISTRATION PROPERTIES

BACKGROUND OF THE INVENTION

This invention relates generally to improvements in the laminated boards used in electronic circuitry.

Printed wiring boards (PWB's) are composites of an insulating core and one or more planar layers of circuitry. The insulating core comprises a thermosetting polymer, such as an epoxy resin, and a suitable reinforcing material, such as glass cloth. The core laminate may be faced with a layer of copper foil to provide an electrically conductive path. The circuit patterns are created by photoimaging and etching of unwanted copper. Where there are multiple layers, the circuits are interconnected by through-plated holes precisely positioned in predetermined locations. A major problem with multi-layer composites is misregistration of the layers. When manufacturing the PWB's, stresses are developed and released. The layers may expand or contract relative to each other and create what are called registration problems. The layers may not be interconnected at the intended places and possibly may cause short circuits. Failure to interconnect layers can be a cause for either failure or rejection of the composite.

The present inventors have investigated the reasons for registration problems and found that the difference in coefficient of thermal expansion between the reinforced laminate and the copper foil creates much of the problem and further that the laminates used commonly in the industry do not respond uniformly when heated. Consequently, the inventors have found methods of providing uniform thermal expansion and matching of the thermal expansion of the laminate and the copper layer, as discussed in detail below.

SUMMARY OF THE INVENTION

A method of determining the reinforcing fiber and thermoset resin content of laminates is disclosed which involves calculating the laminate coefficient of thermal expansion (CTE) as a function of the fiber volume. By then comparing the predicted values with measured values of a set of laminates made with various fiber contents, a corrected relationship of the coefficient of thermal expansion to fiber volume is determined. Thus, laminates can be made with a predetermined uniform coefficient of thermal expansion, thereby providing a laminate system which avoids registration problems during the fabrication of multilayer printed circuit boards.

In one aspect, the invention is a system of woven fiber reinforced thermosetting polymer laminates having a coefficient of thermal expansion which is substantially the same in the warp and fill directions of the reinforcing fabric. The coefficient of thermal expansion may be adjusted to match adjacent layers of metal foil. More particularly, laminates of epoxy resins with glass fibers according to the invention can be made to have a CTE which matches that of copper, that is, about 17.4 ppm/°C. in the temperature range of 25°–125° C. This matching of the CTE is accomplished by adopting glass fabric styles having a ratio of fiber volume in the warp to the fill directions of 1/1.08±0.10. The amount of epoxy resin is determined by its CTE and Young's Modulus and for the familiar FR-4 epoxy (CTE about 59 ppm/°C. and Young's Modulus 0.53) will make up about 53±2% by weight of the laminates.

In another aspect the invention comprises woven glass fabrics having a ratio of fiber volume in the warp to the fill directions which can be used in laminates of varying thicknesses but which have substantially the same CTE in both the warp and fill directions.

In still another aspect, the invention comprises a printed circuit board comprising laminates having substantially the same coefficient of thermal expansion in both the warp and fill dimensions and combined with at least one layer of copper where the CTE of the laminate matches that of the copper layer. The laminates may be bonded with bonding sheets having a curing temperature below the glass transition temperature of the laminates.

DESCRIPTION OF THE PREFERRED EMBODIMENTS

Fabrication of Laminates

The chosen resin is reinforced with a woven material, most commonly of glass fibers, although other materials such as aramids or quartz may be used. The impregnation of the fabric may be done in any manner known in the art, for example, passing the substrate through a solution of the high molecular weight resin at a predetermined temperature. Following impregnation, the fabric may be passed through metering rolls so that the desired amount of resin is retained in the fabric, while any excess is squeezed out. Generally speaking, the resin content in commercial laminates is in a range of from about 30% to about 80% by weight of the cloth. In one example the present invention, the amount of resin is within the range of about 50% to 57% for a brominated epoxy resin commonly designated as FR-4. The amount used is determined by the coefficient of thermal expansion of the resin, which typically will be between 55 to 65 ppm/°C. and the resin's Young's Modulus which typically will be between 0.45 to 0.55 Msi.

Some specific examples of the resin systems which may be employed in the process of the present invention include EPON resins from the Shell Chemical Company, which resins are the reaction products of epichlorohydrin and bisphenol-A. These series of resins are sold under the name of EPON 813, EPON 815, EPON 812, EPON 8201, EPON 825, EPON 826, EPON 828, EPON 8280, EPON 830, EPON 834, EPON 871, etc. Other epoxy resins which may be used include Dow 511, Dow 521, and Dow 531 (Dow Chemical Co.) A very common epoxy resin is Dow 521 which is designated FR-4.

The methods of the invention are believed to be applicable also to other thermosetting resins including polyimide, bismaleimide, triazine, polyester, and cyanate ester resins. However, the required balance between the resin and the reinforcing fibers will differ from those appropriate for FR-4 epoxy laminates as described below.

The resin solution will include a curing agent, depending upon the type of resin system which has been chosen as the impregnating agent. Examples of curing agents which may be employed will include aliphatic amines such as diethylene triamine, triethylene tetraamine, and/or amides of the cyanoguanidine type.

Solvents such as ketones, including methyl ethyl ketone, diethyl ketone, etc., N-methyl-2-pyrrolidone, etc., benzene, toluene, etc., may be employed to form the solution of the resin system and the curing agent.

The solution may also contain accelerators such as 2-methyl imidazole, BDMA, butadiene acrylonitrile, 2-ethyl-4-methyl imidazole, 2phenylimidazole, 2-undecyl imidazole, 2-heptadecyl imidazole, etc., including their cyanoethyl and trimellitate derivatives.

The impregnated cloth may be subjected to a B-stage cure by heating in an oven at a temperature in a range of from about 150° C. to about 190° C. Thereafter, the impregnated cloth may be laid-up utilizing a predetermined number of plies with at least one sheet of a conductive metal and pressed at a temperature which may range from about 150° to about 200° C. and a pressure in the range of from about 100 to about 2000 psig (689.5–13,789 kPa gauge) to provide the desired laminate.

Glass Fabrics

Woven glass fabrics are generally made of yarns having up to about 1700 filaments, such filaments having diameters from about 3 to 15 μm. Plain weave fabrics of the type described here may be characterized in having a specified number of lengthwise yarns (warp) per inch (or ram) and crossing yarns (fill) per inch (or ram). We have found that the amount of reinforcement in each direction of the fabric is an important determinant of the laminate CTE. The volume of reinforcement per unit area of a fabric, V1, is given by the following expression:

$$V1 = Nf \cdot Ac \cdot Ny$$

where
  Nf is the number of filaments in each yarn
  Ac is the cross sectional area of each filament
  Ny are the number of yarns per unit length
  The volume reinforcement per unit area in the fill and warp directions of a fabric are given by:

$V1_f = Nf \cdot Ac_f \cdot Ny_f$ for the fill direction
$V1_w = Nf \cdot Ac_w \cdot Ny_w$ for the warp direction
and the ratio, R, of fill to warp volumes is given by:
$R = (Nf_w \cdot Ac_w \cdot Ny_w)/(Nf \cdot Ac_f \cdot Ny_f)$ Thus, the ratio of fiber volume in the warp and fill directions is determined by the number of filaments in each yarn, their cross sectional area and the number of yarns per unit of length. It should be noted that the general method used is believed to be applicable also to more complex woven fabrics as well such as basket weaves, satin weaves and twill weaves. The yarns will have a CTE depending on the material used; typical glass yarns having a CTE of about 5 ppm/°C. Generally, the volume of fibers in the fill direction should approximately equal the volume of fibers in the warp direction. However, we have found that the fill yarns preferably should be slightly larger in volume compared to the warp yarns in order to provide the most uniform thermal expansion/contraction.

Current multilayer thin laminates are usually manufactured using well established glass styles, defined, for example, in ANSI/IPC specification EG 140. Following woven glass styles are used for vast majority of multilayer boards: 106, 1070, 1080, 2112, 2113, 2116, 7628. Properties of these fabrics are given in Table I below.

TABLE I

| | | | Typical Glass Fabric Styles | | | | | | | | | |
|---|---|---|---|---|---|---|---|---|---|---|---|---|
| | | | Warp Yarn | | | | Fill Yarn | | | | | |
| Style No. | Weave | Glass | Type | Filament Dia. | No. | Yarn/ inch (mm) | Glass | Type | Filament Dia. | No. | Yarn/ inch (mm) | Fabric Thickness | Weight |
| 106 | plain | E | cont. | 0.00023" (5 μm) | 102 | 56 (2.2) | E | Cont. | 0.00023" (5 μm) | 102 | 56 (2.2) | 0.0015" (38 μm) | 0.73 oz/yd² (24.75 g/m²) |
| 1070 | plain | E | cont. | 0.00023" (5 μm) | 204 | 60 (2.4) | E | Cont. | 0.00023" (5 μm) | 204 | 35 (1.4) | 0.002" (50 μm) | 1.06 oz/yd² (35.94 g/m²) |
| 1080 | plain | E | cont. | 0.00023" (5 μm) | 204 | 60 (2.4) | E | Cont. | 0.00023" (5 μm) | 204 | 47 (1.9) | 0.0025" (50 μm) | 1.45 oz/yd² (49.16 g/m²) |
| 2112 | plain | E | cont. | 0.00029" (7 μm) | 204 | 40 (1.6) | E | Cont. | 0.00029" (7 μm) | 204 | 39 (1.5) | 0.0034" (86 μm) | 2.10 oz/yd² (71.20 g/m²) |
| 2113 | plain | E | cont. | 0.00036" (9 μm) | 130 | 60 (2.4) | E | Cont. | 0.00036" (9 μm) | 204 | 56 (2.2) | 0.0029" (74 μm) | 2.37 oz/yd² (80.36 g/m²) |
| 2116 | plain | E | cont. | 0.00029" (7 μm) | 204 | 60 (2.4) | E | Cont. | 0.00029" (7 μm) | 204 | 58 (2.3) | 0.0038" (97 μm) | 3.22 oz/yd² (109.18 g/m²) |
| 7628 | plain | E | cont. | 0.00036" (9 μm) | 408 | 44 (1.7) | E | Cont. | 0.00036" (9 μm) | 408 | 32 (1.3) | 0.0068" (72 μm) | 6.00 oz/yd² (203.43 g/m²) |

An analysis of these glass constructions reveals that most of them have significantly different glass content in warp and fill direction. Generally, the amount of glass in the warp direction is greater than or equal to the amount of glass in the fill direction. The amount of glass oriented in each direction is an important factor in determining the thermomechanical properties of the laminate. We have found that only when the laminates are substantially symmetric in the warp and fill directions and preferably with the fill direction having a higher glass content i.e., contrary to the usual fabrics, is it possible to match the CTE in both warp and fill.

To achieve this match, the fiber volume fraction in each direction has to be substantially equal. For glass fibers with FR-4 epoxy, the fiber volume fraction should be 30±2% in the warp direction and 32.5±2% in the fill direction. It is very clear that most of the glass styles presently used cannot achieve this requirement since the volume of warp fibers exceed those in the fill direction.

In order to achieve a new system of multilayer thin core laminates capable of avoiding registration problems in multilayer constructions, we have created several new glass styles, all of them with approximately equal yarn count in warp and fill direction. The optimum volume ratio is 1:1.08±0.10 of warp fibers vs. fill fibers per unit of width. The difference between the fibers in warp and fill is related to their relative effect on laminate CTE values. To achieve a 17.4 ppm/°C. thermal expansion coefficient with glass fibers used with epoxy resins we prefer 0.300 fiber volume fraction for the warp fibers and a 0.325 fiber volume fraction for the fill fibers. Balanced fabrics will yield improved laminates, however, best results come from fabrics where the fill fiber volume is approximately 8% higher than the warp fiber volume.

For practical reasons, the thin laminates preferably are made in increments of 0.001 inch (25μm). Therefore, the following new glass styles are preferred to provide a group of laminates having a range of desirable thickness and having uniform CTE. All the new glass sytles will yield a CTE of 17.4 ppm/°C. when 53% resin content by weight of standard brominated FR-4 epoxy resin (CTE=59 ppm/°C. and Young's Modulus 0.53 Msi) is used as polymeric matrix. The yarns used will vary in thickness but will be equal to or less than the thickness of the laminate layer to be produced. The eight preferred fabric styles of the invention and their real weights are given in the following table for typical FR-4 epoxy resin.

TABLE II

| STYLE NAME | LAMINATE THICKNESS IN (MM) | GLASS AREAL WEIGHT g/m²* | RESIN AREAL WEIGHT g/m²* |
| --- | --- | --- | --- |
| A fill/warp = 1.08 ± 0.10 | 0.001 (0.025) | 20.4 | 23.2 |
| B fill/warp = 1.08 ± 0.10 | 0.0015 (0.038) | 30.5 | 34.8 |
| C fill/warp = 1.08 ± 0.10 | 0.002 (0.05) | 40.7 | 46.4 |
| D fill/warp = 1.08 ± 0.10 | 0.003 (0.08) | 61.0 | 69.6 |
| E fill/warp = 1.08 ± 0.10 | 0.004 (0.1) | 81.4 | 93.2 |
| F fill/warp = 1.08 ± 0.10 | 0.005 (0.13) | 102 | 116 |
| G fill/warp = 1.08 ± 0.10 | 0.006 (0.15) | 122 | 139 |
| H fill/warp = 1.08 ± 0.10 | 0.007 (0.18) | 144 | 163 |

*Nominal weight-variation about ± 5%

All the above glass styles, when coated with FR-4 resin and laminated will yield laminates with CTE in both directions close to the CTE of copper. The principle (matching the copper CTE) is applicable to other resin systems besides the typical brominated epoxy system commonly used in FR-4 laminates. For other resins systems, different glass styles may be used which depend on the resin CTE, resin modulus, and resin density. The resin/fiber ratio (volume or weight percent) needed in order to achieve a laminate CTE of 17.4 ppm/°C. in general will be different from that listed above in the table.

Registration of Laminates

A great deal of effort has been expended by the laminating industry and by printed circuit industry to minimize, predict and, if possible, to eliminate the misregistration problems in multilayer printed circuit boards.

Conventional laminates for multilayer printed circuits consist of woven glass reinforced plastics (epoxy, polyimide and other) of various thickness from 0.002 in. up to 0.039 in. (0.05-1 ram). These laminates are typically clad with a layer of copper foil on one or both sides, typically 0.0007 in., 0.0014 in. and 0.0028 in. (0.018, 0.035, and 0.07 mm) in nominal thickness. These thicknesses correspond to ½ oz./sq. ft., 1 oz/sq. ft., 2 oz/sq. ft. (152 g/m², 305 g/m², 610 g/m²) areal weight.

As previously mentioned, various woven fiber constructions are used for typical laminates. For the most part, the selection of fabric styles as well as the combination of these fabrics needed to achieve certain thickness tolerances are arrived at empirically. Typically, the resin content and the pressing conditions are varied to obtain the appropriate thickness.

Figure 1:
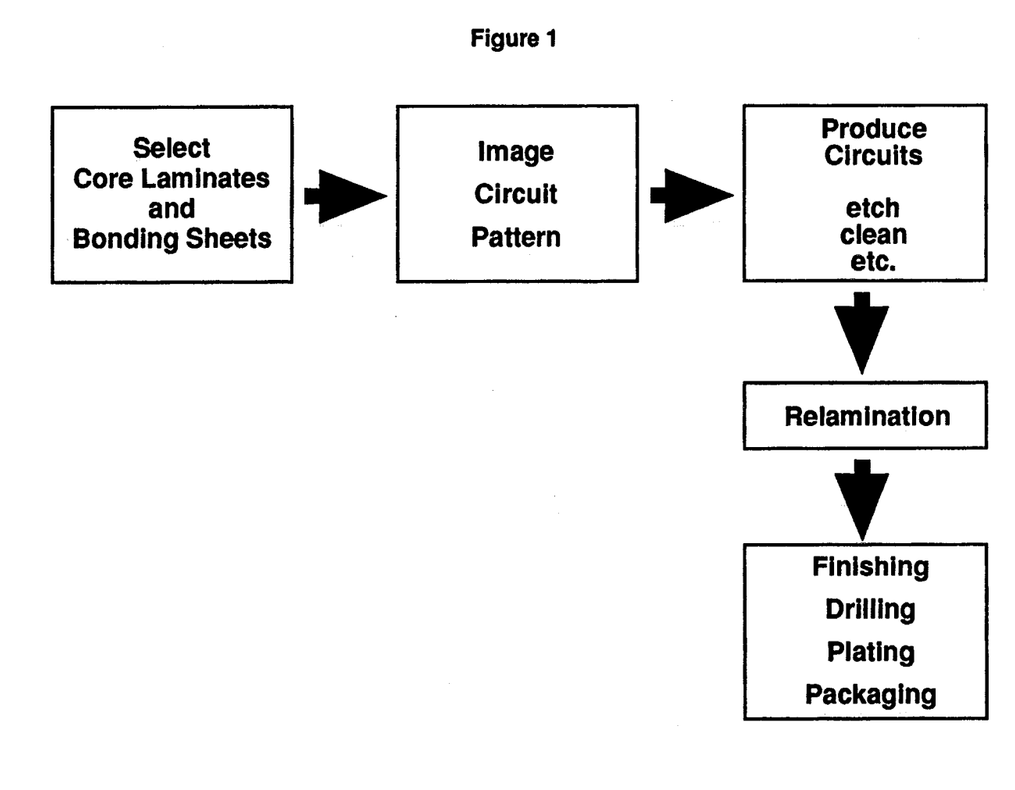
FIG. 1 is a simplified flow chart for multilayer laminate construction.

Various combinations of laminate and copper thicknesses are used as building blocks of multilayered printed circuit boards. Major disadvantages of the current laminate system are its complexity and poor multilayer registration. The individual copper-clad laminates are first etched to form circuit patterns and are later relaminated to form a multilayer board circuit board. The multilayered circuit board can have as few as 3 and as many as 42 circuit layers. A flow chart for multilayer fabrication is shown in FIG. 1.

Since the layers of the printed circuit board must be interconnected, the dimensions of the circuit pattern must match very accurately. The layers are interconnected by drilling holes in the appropriate locations and plating the through holes with copper.

A multilayer board is currently designed by a customer specifying the number of conductive layers and the overall thickness of the board. It is usual practice not to mix more than three types of fabrics or resin contents within a single composite board. One to three layers of bonding sheet are used to bond the laminates together, depending on the thickness of the final board. These are made of the typical glass fabrics previously described. The resin content of the bonding sheets are usually higher than the laminates from these cloths. One of the reasons for this is that the excess resin is needed to fill in between the circuitry on the multilayered board to keep the entire board uniformly thick. The laminate supplier has standard products to make any thickness of laminate desired. There are some standard configurations but frequently a user may have special requirements, for instance, if chemical resistance is particularly important, resin-rich laminates are placed near the surface. Finer cloth prepregs are also used near the surface to give a smoother finish. Heavier fabrics are less expensive so a thick board made from 7628 cloth might be desirable. On the other hand, it is more difficult to drill holes in the 7628 than a finer glass cloth.

Registration is now accomplished on a multilayered board by using a "compensation factor" for the circuit pattern. The circuit pattern is made larger or smaller to compensate for the laminate shrinking or expanding during the multilayer pressing. This factor takes into account many different parameters, thickness of the board, type of resin used, press cycle, pressure, and heat rise. Even though the compensation factor reduces misregistration errors, they still remain a problem due to the variability in the circuit patterns and the CTE of the constituent laminates.

It has been well known that in the process of developing the circuit pattern by imaging and then etching the circuit pattern on laminates initially clad with copper foil, the laminate changes dimensions. The resulting circuit pattern does not exactly match the original pattern on the master.

We have concluded that another primary cause of misregistration in multilayer laminates is the differences in the circuits. The amount of copper etched from each layer is highly variable and is dictated by the needs of the application. Because in typical multilayer boards the CTE of the copper and laminate differ, the thermal expansion of the boards is dependent on the circuitization pattern. In many typical PWB's "ground planes" which contain considerable copper will have CTE's which differ significantly from layers which have only circuit lines. We have found that this source of variability can also be eliminated by matching the laminate and copper CTE's.

Many studies have shown that the dimensional stability as measured by the IPC 2.4.39 test method does not often correlate with the results of multilayer registration studies. There are several possible reasons for this lack of agreement. The boards go through several printing, etching, cleaning, and plating processes before being incorporated into a multilayer board. The multilayer lamination process subjects the board additional thermal and pressure cycles. Clearly, reducing stresses in the laminate by making the copper/press plate/and laminate have the same CTE will reduce variability. In addition since all laminates absorb moisture and expand, control of moisture content is extremely important, This is typically done using well controlled post baking cycles. Precise control of all of the processes is important.

The maker of multilayer boards cannot control the CTE of the laminate and the degree to which the boards are covered with circuitization. Typical multilayer constructions require that certain thickness tolerances for the final multilayer be achieved. This often requires the maker to choose a variety of fabric styles and resin contents. They have little control over the CTE of each component laminate. In fact, it is often not even specified. We propose precise CTE control of all laminates used in the multilayer process while at the same time allowing the fabricator to attain the desired thickness in the multilayer construction. Because the laminate of this invention matches the copper CTE, an etched board has the same CTE as that of a fully clad board.

Figure 2:
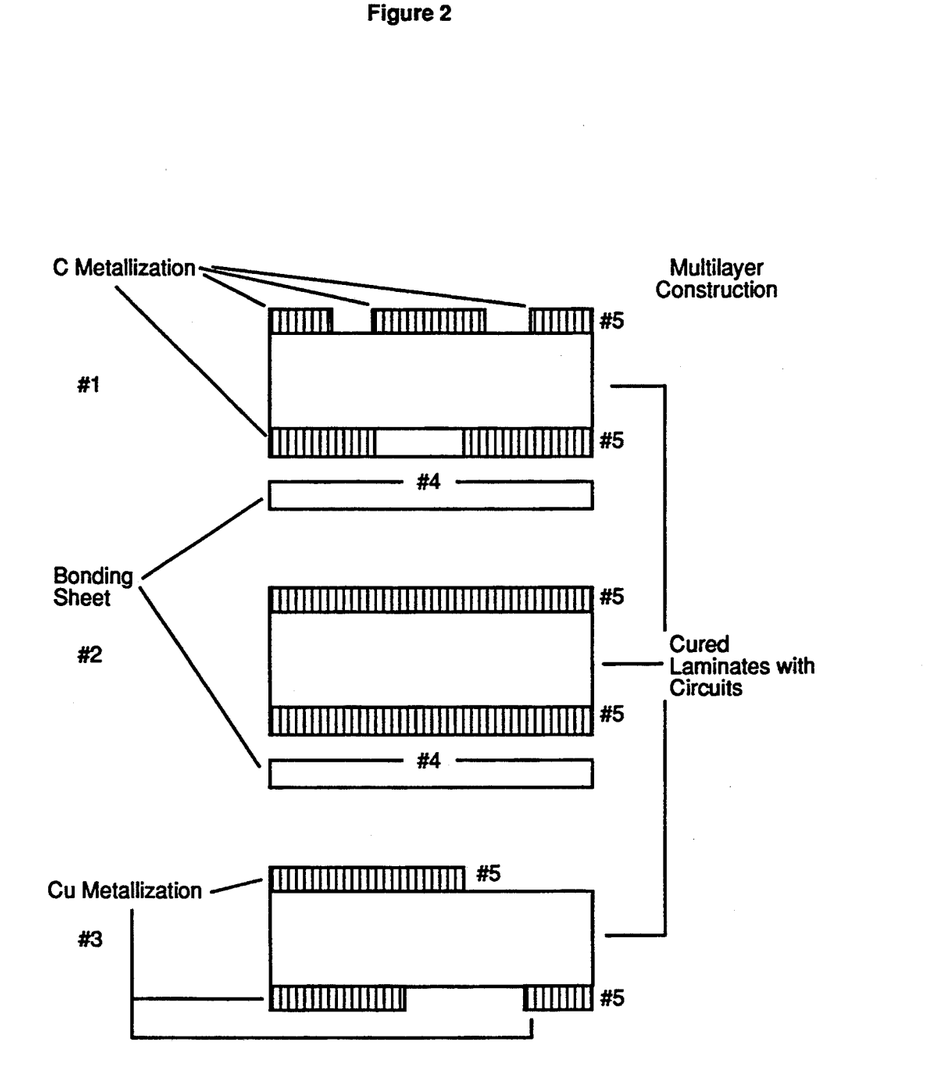
FIG. 2 is a cross sectional view of a typical multilayer construction.

To illustrate these points consider a typical multilayer construction illustrated in FIG. 2, In this example three laminates with circuitization on both sides are bonded together with two bonding sheets. The bonding sheets are typically unclad woven fabric prepregs. Their main function is to "glue" the three laminates with circuits together in the relamination process. The circuit laminates and the bonding sheets could in principle be comprised of any of the many possible laminate constructions.

The properties of this example 0.024 inch (0.6 ram) thick multilayer board are illustrated in Table III.

TABLE III

| Layer # | Type | Resin Content % Weight | Warp Unclad CTE PPM/C | Fill Unclad CTE PPM/C | Thickness Mils |
|---|---|---|---|---|---|
| 1 | 2113 fabric | 53 | 14.0 | 21.5 | 4.6 |
| 2 | 7628 fabric | 44 | 12.5 | 16.2 | 7.3 |
| 3 | 2113 fabric | 53 | 14.0 | 21.5 | 4.6 |
| 4 | 106 fabric | 61 | 18.5 | 20.0 | 1.6 |
| 5 | copper | ***** | 17.4 | 17.4 | 0.7 |

Notice that the unclad laminate CTE's of each layer are different from that of copper. When these boards are completely covered with copper, the CTE of the composite (copper plus laminate) is in between that of the copper and the unclad laminate. Thus the amount of circuitization strongly influences the CTE.

Figure 3:
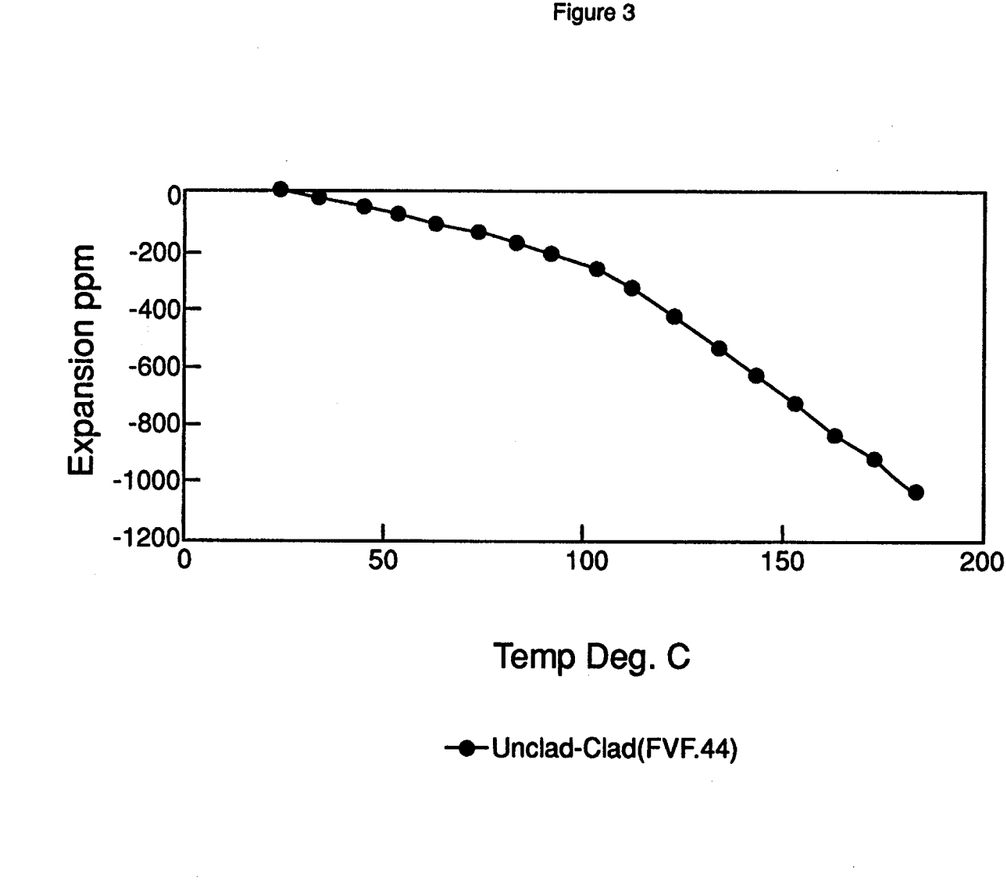
FIG. 3 is a plot of differential expansion between a copper clad laminate and an unclad laminate both being glass-reinforced epoxy resin.

We have estimated the magnitude of this effect in the situation where one of the boards is a copper clad laminate (typical of a ground plane) while the other is exactly the same laminate type but is unclad. The results are presented in FIG. 3. As can be seen the amount of misregistration resulting from the differential expansion can be quite large. These calculations were carried out for a typical 1 oz. copper clad board with a 44 percent resin content and 7628 style fabric (not according to the invention). At room temperature (23° C.) the two boards are in registration (i.e., zero differential). As the temperature is increased the copper clad board expands more than the unclad board and at 130° C., a typical bonding temperature, the differential expansion between a clad and unclad board is approximately 500 ppm. This means that features spaced 10 inches (254 mm) apart would move five mils (0.13 mm) with respect to each other. Obviously this is a problem in boards with 5 mil spacing for the conducting lines.

A second feature of this conventional system is that the expansion in the warp direction differs from that in the fill direction. Thus a "compensation factor" applied to the circuit pattern in the form of magnification changes will not be able to simultaneously account for both directions.

A third feature is that the CTE's of each laminate differ, thus requiring different compensation factors for each laminate.

For the system described in this invention the constituent materials used to make the same 0.024 inch (0.6 mm) thick multilayer board are shown in Table IV.

TABLE IV

| Layer # | Type[1] | Resin Content % Weight | Warp Unclad CTE PPM/C | Fill Unclad CTE PPM/C | Thickness Mils |
|---|---|---|---|---|---|
| 1 | E | 53 | 17.4 | 17.4 | 4.0 |
| 2 | H | 53 | 17.4 | 17.4 | 7.0 |
| 3 | F | 53 | 17.4 | 17.4 | 5.0 |
| 4 | C | 53 | 17.4 | 17.4 | 2.0 |
| 5 | copper | ***** | 17.4 | 17.4 | 0.7 |

[1]Designations taken from Table I.

A system of laminates with the CTE carefully controlled to match the copper CTE eliminates many of the registration problems.

In this example we have chosen the bonding sheets to be such that they also match the CTE of copper. This will provide the most stable, stress free laminate. However, it is possible to achieve good registration with bonding sheets which have CTE's different from that of the copper. In situations where more resin rich bonding sheets are desirable, they can be used.

Processing of Laminates

Another aspect of this invention described above deals with processing of the laminates. The laminates are typically made in heated multi-opening presses at pressures ranging from 200 psig to 1000 psig (1,379 to 6,895 kPa gauge). The copper foil which is to be bonded to the laminate is contacted by a press plate which is often made from hardened stainless steel alloys. These plates, while excellent in their resistance to denting, possess a CTE of 10.85 ppm/°C. which differs considerably from the CTE of copper 17.4 ppm/°C. The differences in the CTE cause stresses at the plate vs. copper foil vs. laminate interface during the heating and cooling cycle in laminate manufacturing.

Even when the copper and the laminate CTE's match, the press plate may influence the shrinkage of the copper clad laminate as it cools down from the pressing temperature. The magnitude of the effect will also be highly dependent on the friction coefficient and the amount of slippage at the surface. This will lead to variability in manufacture of dimensionally stable laminates.

In a preferred embodiment of this invention, the laminate are manufactured using press plates which closely match the CTE of copper. These can either be copper plates or stainless steel alloys such as 304 or 316 with CTE values close to the 17.4 ppm/°C. value for copper. The close match of the copper and laminate will insure that no instabilities arise from uncontrolled stresses in the laminates.

Another aspect of this invention related to processing concerns the bonding sheets. The CTE of laminates is essentially linear below the glass transition temperature of the resin. However, above the transition temperature the laminate CTE is reduced substantially by the softening of the resin system. (See for example, FIG. 6.) Above the resin glass transition the slope of this measured expansion cure is reduced significantly. Thus, it is desirable to bond the laminates below this temperature.

A preferred embodiment of this invention would include bonding sheets, or processes which cure the multilayer laminate below the glass transition temperature of the circuitized laminates.

Prediction of the CTE of Laminates

To predict the CTE of woven glass reinforced laminates we have developed two methods which yield substantially the same results. The first method combines micromechanics equations with measurements on existing woven glass fabrics to arrive at laminate CTE estimates. The second method uses these same micromechanics expressions in conjunction with finite element analysis of woven fabrics to predict the CTE properties. Only the first method will be described in detail below.

Both methods require the following constituent materials properties as input data.

TABLE V

| Constituent Material Properties | Typical Values |
| --- | --- |
| $E_m$ Young's Modulus of the matrix | 0.53 Msi |
| $V_m$ Matrix Poisson's Ratio | 0.35 |

TABLE V-continued

| Constituent Material Properties | Typical Values |
| --- | --- |
| $Q_m$ Matrix density | 1.33 g/cc |
| $A_m$ Matrix thermal expansion coefficient | 59 ppm/°C. |
| $E_f$ Young's Modulus of the reinforcement | 10.7 Msi |
| $V_f$ Reinforcement Poisson's Ratio | 0.22 |
| $Q_f$ Reinforcement density | 2.54 g/cc |
| $A_f$ Reinforcement thermal expansion coefficient | 5.0 ppm/°C. |

The properties shown in Table V are typical properties for an FR-4 resin system and the E-glass commonly used in printed circuit board laminates.

The micromechanics equations relate the thermomechanical properties of the constituent materials to those of unidirectional plies. This is done through a series of algebraic expressions developed by researchers working in the area of aerospace composites, in particular, the expressions contained in the University of Delaware Center for Composite Materials micromechanics program COMPCAL.

For the unidirectional plies we assume that the fibers are continuous and all oriented in the same direction. The output of the micromechanics calculations is a series of ply thermomechanical properties. It should be noted that the resulting ply properties are anisotropic owing to the orientation of the fibers. These are listed below:

$E_1$: Ply modulus parallel to fibers
$V_{1t}$: major axis Poisson's ratio
$G_{1t}$: Ply major axis shear modulus
$G_{tt}$: Ply minor axis shear modulus
$k_t$: Ply effective bulk modulus
$E_t$: Ply transverse modulus
$V_{tt}$: Ply minor Poisson's ratio
$A_1$: Ply CTE along fiber
$A_t$: Ply CTE perpendicular to fiber These properties are computed as a function of fiber volume fraction and temperature. Below are the micromechanics equations used to compute the above ply properties from the constituent material properties listed in Table V.

LAMINATE MODULUS PARALLEL TO AXIS $$E_1(x) = [E_f x + E_m(1-x)] + \frac{4[v_m - v_f]^2 kt_f kt_m G_m x(1-x)}{[kt_f + G_m]kt_m + [kt_f - kt_m]G_m x} \quad (2)$$

LAMINATE MAJOR AXIS POISSON RATIO $$v_{1t}(x) = [v_f x + v_m(1-x)] + \frac{[v_m - v_f][kt_m - kt_f]G_m x(1-x)}{[kt_f + G_m]kt_m + [kt_f - kt_m]G_m x} \quad (3)$$

LAMINATE MAJOR AXIS SHEAR MODULUS $$G_{1t}(X) = G_m \frac{G_m + Glt_f + [Glt_f - G_m]X}{G_m + Glt_f - [Glt_f - G_m]X} \quad (4)$$

LAMINATE MINOR AXIS SHEAR MODULUS $$G_{tt}(x) = \frac{G_m[kt_m(G_m + Gtt_f) + 2Gtt_f G_m + kt_m(Gtt_f - G_m)x]}{kt_m[G_m + Gtt_f] + 2Gtt_f G_m - [kt_m + 2G_m][Gtt_f - G_m]x} \quad (5)$$

LAMINATE EFFECTIVE BULK MODULUS $$k_t(x) = \frac{[kt_f + G_m]kt_m + [kt_f - kt_m]G_m x}{kt_f + G_m - [kt_f - kt_m]x} \quad (6)$$

LAMINATE TRANSVERSE MODULUS $$E_t(x) = \left[ \frac{0.25}{K_t(x)} + \frac{0.25}{G_{tt}(x)} + \frac{V_{1t}(x)^2}{E_1(x)} \right]^{-1} \quad (7)$$

LAMINATE MINOR AXIS POISSON RATIO $$V_{tt}(x) = \frac{2E_1(x)k_t(x) - [E_1(x)E_t(x)] - 4v_{1t}(x)^2 k_t(x)E_t(x)}{2E_1(x)k_t(x)} \quad (8)$$

-continued

LAMINATE CTE ALONG THE AXIS $$A_1(x) = \frac{xA_fE_f + (1-x)A_mE_m}{xE_f + (1-x)E_m} \quad (9)$$

LAMINATE CTE TRANSVERSE TO THE FIBER AXIS $$ff(x) = 1 - x \quad (10)$$
$$A_t(x) = A_f(1 + v_f)x + A_m(1 + v_m)ff(x) - [V_fx + v_m(1-x)]A_1(x)$$

where:
x is the fiber volume fraction
$Et_f = E_f$ is the fiber transverse modulus $$G_m = \frac{E_m}{2[1 + v_m]} \text{ is the resin shear modulus}$$

$$kt_f = \frac{E_fEt_f}{2[1 - v_fEt_f - 4v_f^2Et_f]} \text{ is the fiber bulk modulus}$$

$$kt_m = \frac{G_m}{1 - 2v_m} \text{ is the resin bulk modulus}$$

The resin density and the fiber density do not appear explicity in any of the equations but do enter into the relationship when we convert from ply fiber volume fraction to ply weight volume fraction. This equation is given below.

$$x(y) = \frac{1}{[1 + (Q_f/Q_m)][(1/(1-y)) - 1)]} \quad (11)$$

where
$Q_f$ is the fiber density
$Q_m$ is the matrix density
x is the fiber volume fraction
y is the matrix weight fraction The next step in the process is to produce laminate properties by stacking the unidirectional plies and calculating their properties. For convenience, we calculate only symmetrical plies oriented a 90° angles from each other. Rules from calculating both the laminate modulus and the laminate CTE come from lamination theory as described for example, Lo, S.Y. and Hahn, H.T., "Hygrothermal Expansion of Kevlar 49/ Epoxy and S2-Glass/Eposy Composites, Transportion Systems Research Report UCRL 15517, S/C 6641009, Nov. 1982, p.p. 1–22. The equation used in our calculations is given below.

$$A_{sl}(x) = \frac{A_1(x) + [A_1(x) + A_t(x)]\left[v_{1t}(x)\frac{E_t(x)}{E_1(x)}\right] + A_t(x)\left[\frac{E_t(x)}{E_1(x)}\right]}{1 + [1 + 2v_{1t}(x)]\left[\frac{E_t(x)}{E_1(x)}\right]} \quad (12)$$

Printed circuit board laminates are typically made from woven fabrics which have fibers which are oriented in two directions, typically at 90° to one another and designated as the warp and the fill directions of the fabric. Typically the amount of fiber in each of these directions is different. The fiber volume fraction in each direction is easily calculated knowing the fabric construction: filament diameter, yarn weights, and number of yarns per inch in the warp and fill directions and the prepreg resin weight content.

We approximate the impregnated woven fabric structure by using a series of unidirectional cross plies. Each woven fabric layer is approximated by a four layer symmetric cross-ply containing the unidirectional plies with the same fiber volume fraction in the warp and fill direction as that calculated for the woven fabric.

Error in the model is corrected by calibration using precise measurements of the laminate CTE for woven fabrics. Errors in the model arise from two sources. First, by not accounting for the undulation of the fibers, we underestimate the laminate CTE values. Second, the woven fabric laminates consists of fiber bundles with impregnated yarns of very high fiber volume fractions embedded in the neat resin host. The unidirectional model assumes uniformly dispersed fibers. The net effect of this is to produce measured laminate CTE values much lower than would be estimated from the crossply model. This appears to be a dominant effect, as has been verified by using finite element models of woven fabrics.

Figure 4:
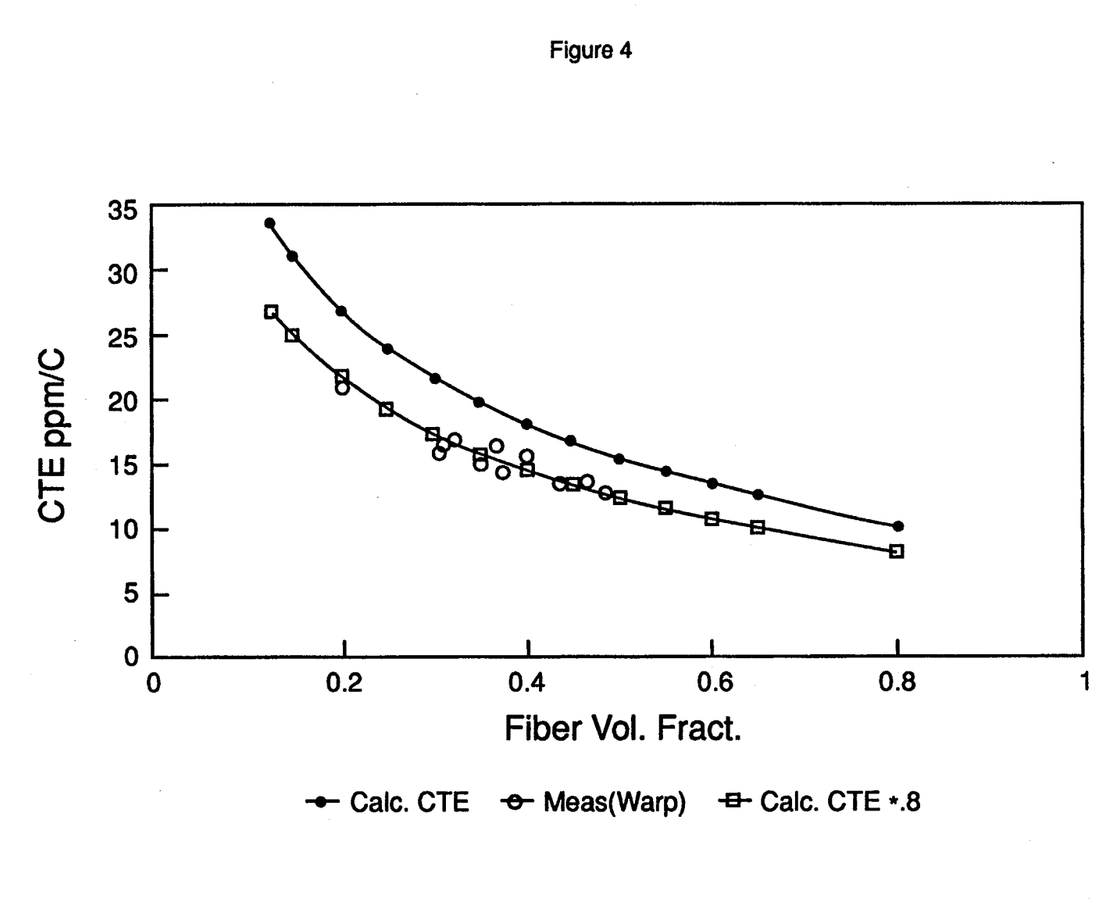
FIG. 4 is a plot of measured and calculated CTE versus fiber volume fraction for the warp direction for a glass-reinforced epoxy laminate.
Figure 5:
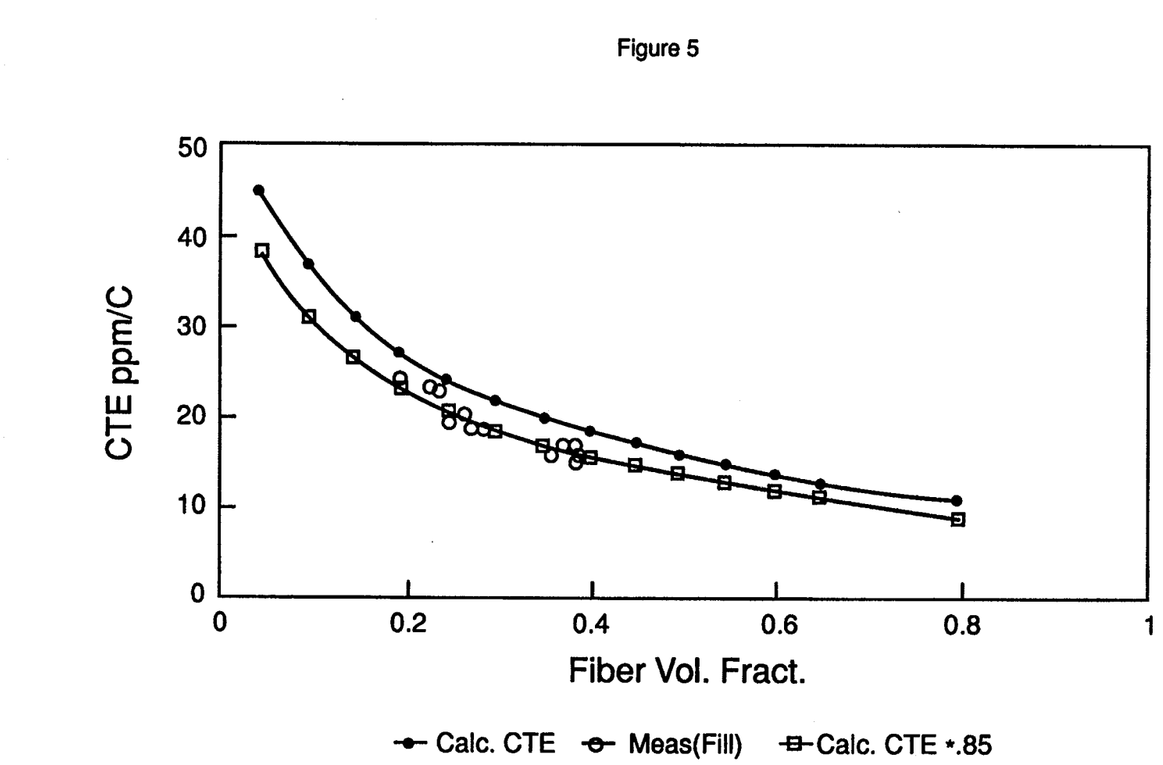
FIG. 5 is a plot of measured and calculated CTE versus fiber volume fraction for the fill direction for a glass-reinforced epoxy laminate.

Using the equations for the cross-ply laminates with the micromechanics equations described previously, the in-plane laminate CTE is calculated as a function of fiber volume fraction. The model calculations tend to overestimate the CTE. However, the model calculations tend to duplicate the shape of the CTE variations as a function of fiber volume fraction. This is important since it allows us to extend the model to provide accurate CTE estimates for systems containing different fiber types and resin compositions. The best fit to the measured data for the warp direction arises by multiplying the calculated curve by 0.80 while the best fit for the fill data is obtained by multiplying the calculated curve by 0.85. Typical data is shown in FIGS. 4 and 5.

More glass is required in the fill direction (relative to warp) since the fill fibers exhibit most undulation in the woven fabric. This reduces their efficiency in producing a laminate with a lower CTE.

Once calculations have been made, they can be plotted as in the figures to provide a theoretical value of CTE for a laminate as a function of the volume of the fiber reinforcement. The actual values are measured from laminates made with varying amounts of fiber reinforcement by a method developed for this purpose.

Our laminate CTE measurement system consists of a 24 inch (609 ram) x-y scan bridge with stepper motors on each axis. Optical encoders are used to record position information. An aluminum block with a heating coil is placed on top of the laminate to heat it between measurements. The heating coil is controlled by a temperature controller and is ultimately controlled by a personal computer. A typical CTE measurement heats the block from room temperature to 170° C. in 15 increments. Once it reaches a temperature for a given increment it pauses for 30 minutes to allow for the entire aluminum block to become isothermal. There are thermocouples monitoring the temperature of the center of the block as well as several other positions. Once the block has equilibrated the table makes a dimensional measurement of the laminate.

For the measurement, a laminate is cut 11 inches (279 ram) in the fill direction and 12 inches (305 mm) in the warp direction. A #75 hole is drilled near each of the four corners separated by 10 inches (254 mm) from each other. These 4 holes are used as fiducials for the measurement. For the measurement, we monitor the distance between these four holes as the laminate is slowly heated and cooled down. Precise measurements can be made on uriclad laminates, clad laminates and the unbonded copper of any thickness.

The monitoring of the holes is done using a video camera. The measurement is begun when one of the holes in the laminates is center on the screen of a TV monitor. The position of the first hole is set to be 0,0. The table moves 10 inches (254 mm) to the next hole and image processing software locates the center of the second hole. The x-y table moves while the video camera under the table remains stationary. The table continues to move around the laminate until the four holes have been located and the table returns to its starting position. A plot of expansion vs. temperature is made and the slope is calculated both above and below the glass transition temperature of the laminate. The slope of the line is the CTE. The repeatability of this system is better than 0.4 ppm/°C.

EXAMPLE 1

Figure 6:
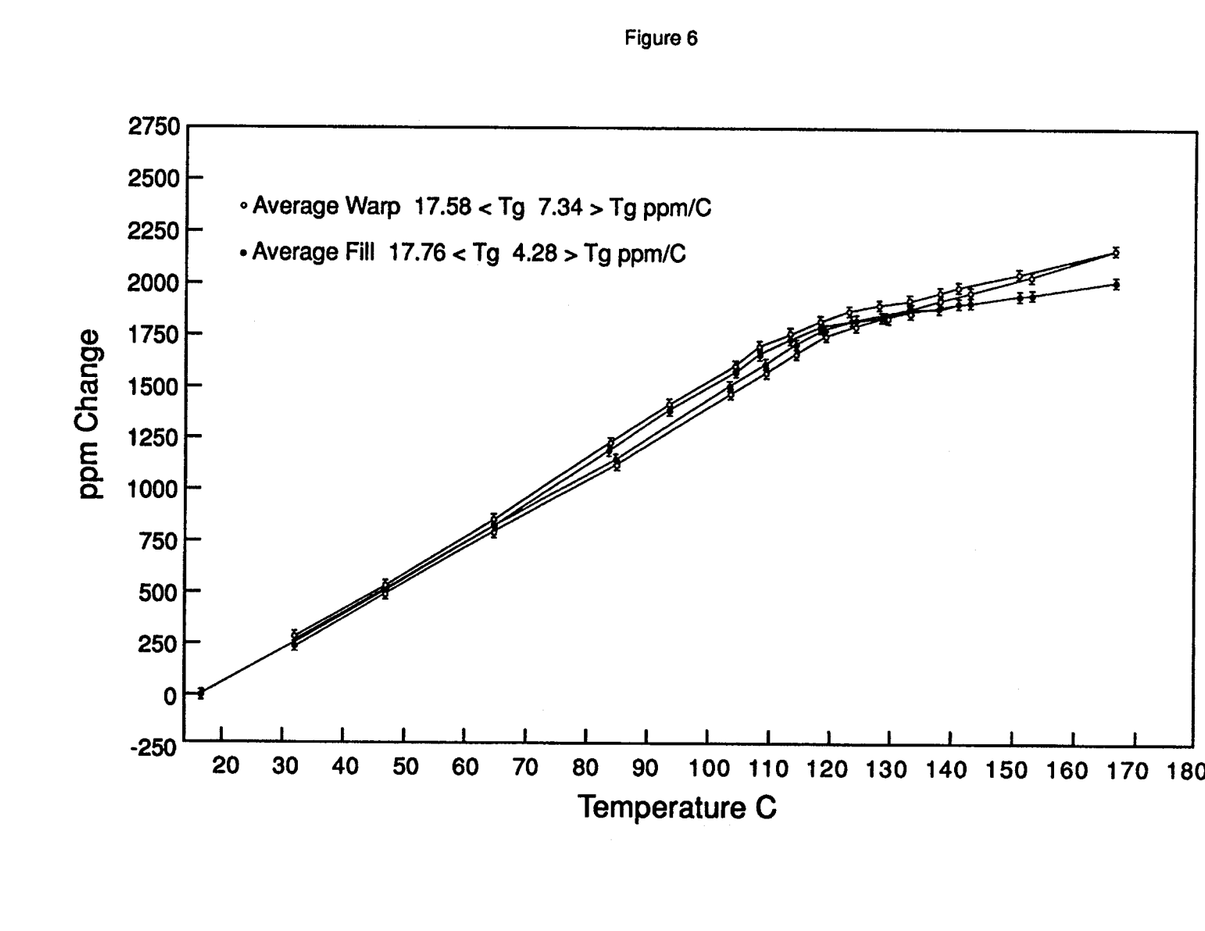
FIG. 6 is a plot of measured dimensional change versus temperature for a glass-reinforced laminate of the invention.

Laminates were constructed from a special fabric design of the invention. The fabric (7623) consists of E-glass with 25 yarns per inch in the fill direction and 22 yarns per inch in the warp direction. The yarn style was the same in each direction (ECG 75-1/0). This fabric has a warp to fill ratio of 1/1.13. Laminates with a 53% resin weight content of FR-4 resin were fabricated and the CTE measured. The results are shown in FIG. 6. As can be seen the expansion in the warp and fill is identical to within measurement error. Furthermore, the measured CTE 17.6 ppm/C° agrees well with that of copper.

EXAMPLE 2

The procedure outlined above has been used to estimate the appropriate fabric parameters and resin contents for alternate resin systems. Specifically two resin systems used by Norplex/Oak are of interest, PY-260 and G-30. PY-260 is a polyimide comprising a bisimide, a polyphenol and dicyandiamide while G-30 is a polyimide with a glass transition temperature above 200° C.

The input properties to the model are given in Table VI.

TABLE VI

|  | G-30 | PY-260 |
|---|---|---|
| $E_m$ Resin Young's Modulus Msi | 0.4 ± .05 | 0.39 ± .05 |
| $V_m$ Resin Poisson ratio | 0.35 | 0.35 |
| $A_m$ Resin CTE ppm/°C. | 56.5 ± 10 | 60 ± 10 |
| $Q_m$ g/cc | 1.22 | 1.26 |

Fiber properties are the same as in Table II.

Figure 7:
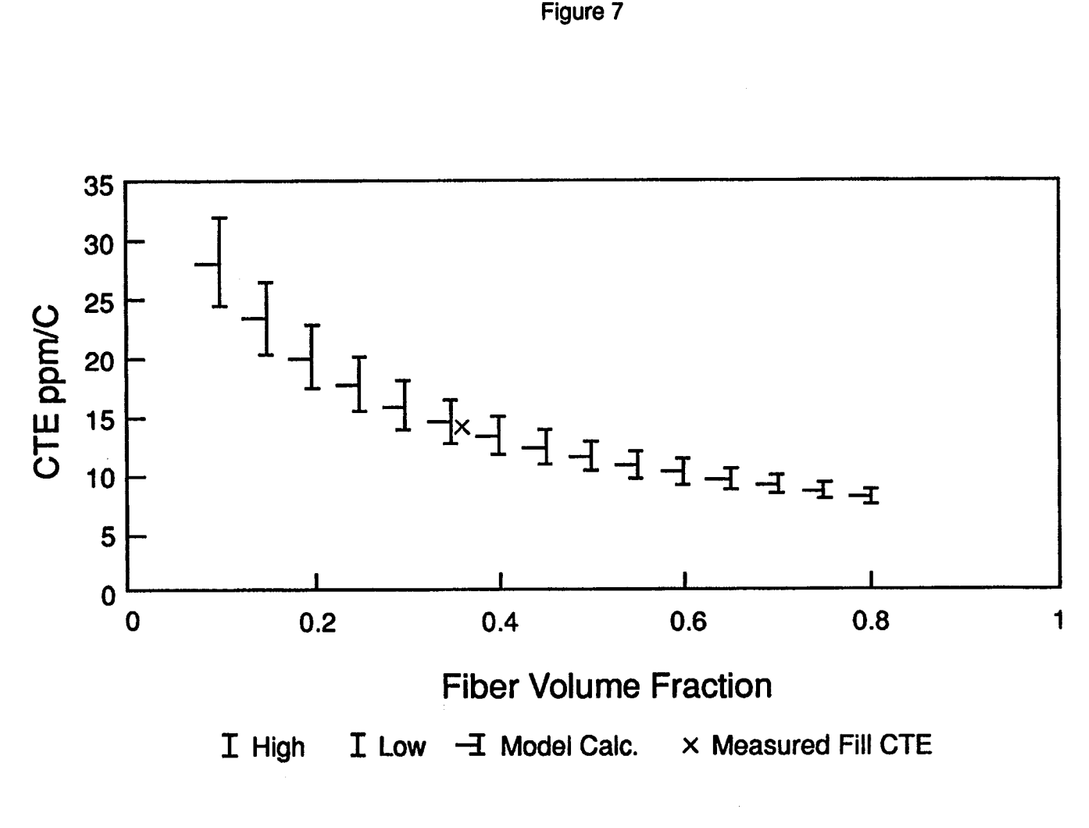
FIG. 7 is a plot of measured and calculated CTE versus fiber volume fraction for the fill direction for a glass-reinforced PY-260 laminate.

FIG. 7 shows the calculated CTE values as a function of fiber volume fraction for the PY-260 resin system. We have applied the same correction factors that were developed from our analysis of the woven fabrics using the FR4 resins system. The calculated curve is the model prediction for the fill direction in the PY-260 laminate. A measured CTE value is also plotted at a fiber volume fraction of 0.36. As can be seen agreement with the model calculations is excellent. Additional comparisons are made in Table VII.

TABLE VII

Comparison of Model Calculations with Laminate CTE Measurements

| Resin System | Fiber Vol. Fraction | Direction | Model Calc CTE ppm/°C. | Meas. CTE ppm/°C. |
|---|---|---|---|---|
| G30 | 0.38 | Fill | 13.6 ± 1.8 | 15.1 ± 0.4 |
| G30 | 0.36 | Warp | 12.6 ± 1.8 | 14.7 ± 0.4 |
| PY-260 | 0.36 | Fill | 13.6 ± 1.8 | 13.9 ± 0.4 |
| PY-260 | 0.38 | Warp | 13.0 ± 1.8 | 14.1 ± 0.4 |

In all cases the measured points are within the calculated range. The errors on the calculated curves arise due to uncertainty in the CTE and modulus of the resin system.

From this work we estimate a much lower fiber volume fraction is needed to obtain a laminate with a CTE matching that of copper 17.4 ppm/°C. For G-30 we obtain a value of 0.20 in the warp and 0.22 in the fill direction. This corresponds to an average weight fraction of 0.65 for the prepreg, with warp to fill ratio of 1.0/1.10. The fabric fiber warp to fill ratio is 1.0/1.10.

For the PY-260 resin system the CTE of copper is matched at a fiber volume fraction of 0.23 in the warp and 0.25 in the fill. This yields an average weight fraction for a prepreg of 0.65. The fabric warp to fill ratio is 1.0/1.08.

We claim:

1. A laminate of a thermosetting polymer reinforced with a woven fabric having a ratio of fiber volume in warp and fill directions of 1/1.08±0.10 said laminate having substantially the same coefficient of thermal expansion in both the warp and fill directions.

2. A laminate of claim 1 wherein the coefficient of thermal expansion is substantially equal to that of an adjacent metal foil layer.

3. The laminate of claim 1 wherein said thermosetting polymer is reinforced with a woven fabric of glass fibers.

4. The laminate of claim 3 wherein said thermosetting polymer is a epoxy resin.

5. The laminate of claim 4 wherein said epoxy resin is a brominated epoxy resin.

6. The laminate of claim 5 wherein said epoxy resin is brominated.

7. The laminate of claim 4 wherein said epoxy resin has a coefficient of thermal expansion of about 59±5 ppm/°C.

8. The laminate of claim 4 wherein said epoxy resin comprises 53±2% by weight.

9. The laminate of claim 1 wherein said glass yarn contains up to 1700 filaments, said filament having diameters from about 3 to 15 μm.

10. The laminate of claim 4 wherein the thermal expansion is uniform in the temperature range of 25°–125° C.

11. A laminate of claim 2 wherein said metal foil layer is copper.

12. A printed circuit board comprised of one or more laminates of claim 1.

13. A printed circuit board comprised of one or more laminates of claim 2.

* * * * *

UNITED STATES PATENT AND TRADEMARK OFFICE
CERTIFICATE OF CORRECTION

PATENT NO. : 5,350,621
DATED : Sep. 27, 1994
INVENTOR(S) : Yuhas et al.

It is certified that error appears in the above-identified patent and that said Letters Patent is hereby corrected as shown below:

Title Page: "Jiri D. Konicek, Onalaska, all of Ill." Onalaska is in the state of Wisconsin, other three inventors are Illinois residents
Column 3, line 25: "2phenylimidazole" should read --2-phenylimidazole--
 line 65: "ram" should read --mm--
 line 67: "ram" should read --mm--
Column 5, line 32: "sytles" should read --styles--
 line 39: "real" should read --areal--
Column 6, line 14: "ram" should read --mm--
Column 7, line 35: after "board" insert --to--
Column 8, line 1: "ram" should read --mm--
Column 12, line 46: "ram" should read --mm--
 line 53: after "15" insert --°--
 line 62: "ram" should read --mm--
Column 13, line 1: "uriclad" should read --unclad--

Signed and Sealed this

Seventh Day of February, 1995

Attest:

BRUCE LEHMAN

Attesting Officer

Commissioner of Patents and Trademarks